(12) United States Patent
Zhao et al.

(10) Patent No.: US 6,787,911 B1
(45) Date of Patent: Sep. 7, 2004

(54) INTERCONNECT WITH LOW DIELECTRIC CONSTANT INSULATORS FOR SEMICONDUCTOR INTEGRATED CIRCUIT MANUFACTURING

(75) Inventors: Bin Zhao, Irvine, CA (US); Maureen R. Brongo, Laguna Hills, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 09/317,536

(22) Filed: May 24, 1999

Related U.S. Application Data

(62) Division of application No. 09/158,337, filed on Sep. 22, 1998, now Pat. No. 6,187,672.

(51) Int. Cl.[7] .......................... H01L 23/48; H01L 23/52
(52) U.S. Cl. ...................... 257/760; 257/759; 257/758
(58) Field of Search ................................ 257/760, 754, 257/758, 513, 510, 296

(56) References Cited

U.S. PATENT DOCUMENTS

| | | | | | |
|---|---|---|---|---|---|
| 5,262,353 | A | * | 11/1993 | Sun et al. | 437/195 |
| 5,317,192 | A | * | 5/1994 | Chen et al. | 257/750 |
| 5,661,344 | A | * | 8/1997 | Havemann et al. | 257/758 |
| 5,747,880 | A | * | 5/1998 | Havemann et al. | 257/759 |
| 5,773,361 | A | * | 6/1998 | Cronin et al. | 438/637 |
| 5,789,819 | A | * | 8/1998 | Gnade et al. | 257/759 |
| 5,834,348 | A | * | 11/1998 | Kwon et al. | 438/240 |
| 5,886,410 | A | * | 3/1999 | Chiang et al. | 257/759 |
| 5,914,851 | A | * | 6/1999 | Saenger et al. | 361/311 |
| 5,929,524 | A | * | 7/1999 | Drynan et al. | 257/758 |
| 5,981,398 | A | * | 11/1999 | Tsai et al. | 438/710 |
| 5,985,470 | A | * | 11/1999 | Spitsberg et al. | 428/689 |
| 5,986,287 | A | * | 11/1999 | Eberl et al. | 257/77 |
| 5,990,007 | A | * | 11/1999 | Kajita et al. | 438/680 |
| 6,077,774 | A | * | 6/2000 | Hong et al. | 438/643 |
| 6,115,233 | A | * | 9/2000 | Seliskar et al. | 361/303 |
| 6,222,269 | B1 | * | 4/2001 | Usami | 257/758 |
| 2002/0089062 | A1 | * | 7/2002 | Saran et al. | 257/759 |

* cited by examiner

*Primary Examiner*—Eddie Lee
*Assistant Examiner*—Douglas W. Owens
(74) *Attorney, Agent, or Firm*—Farjami & Farjami LLP

(57) ABSTRACT

A method is provided for forming an improved interconnect structure on a semiconductor body. A first metal layer is deposited on the semiconductor body. A sacrificial layer having a height is deposited on the first metal layer. The sacrificial layer and the metal layer are patterned to form separate metal lines with the sacrificial layer remaining on said metal lines. A look material is then deposited to fill the gaps bet n metal lines and to cover the sacrificial layer. The low-k material is then removed to a level within the height of the sacrificial layer. The sacrificial layer is then removed. A prove layer is deposited on top of the metal lines and the look material. A dielectric layer is deposited over the protective layer. The protective layer protects the low-k material from attack by chemicals utilized by subsequent process steps to etch vias in the dielectric layer, to strip photoresist, and to clean the vias. The protective layer is then selectively etched away to make contact between a via plug and the metal lines.

21 Claims, 15 Drawing Sheets

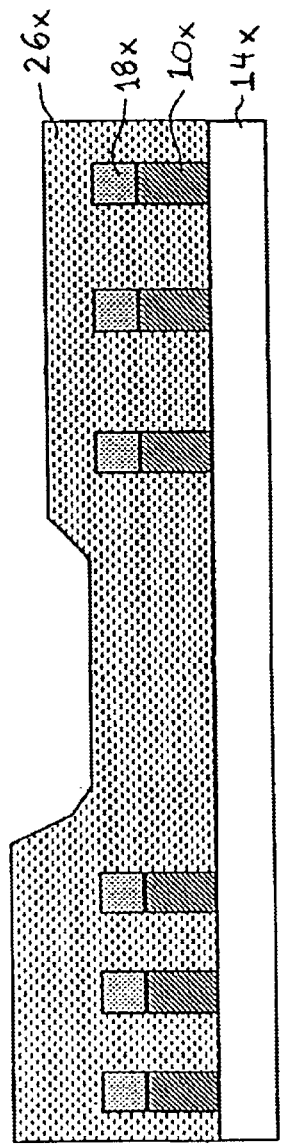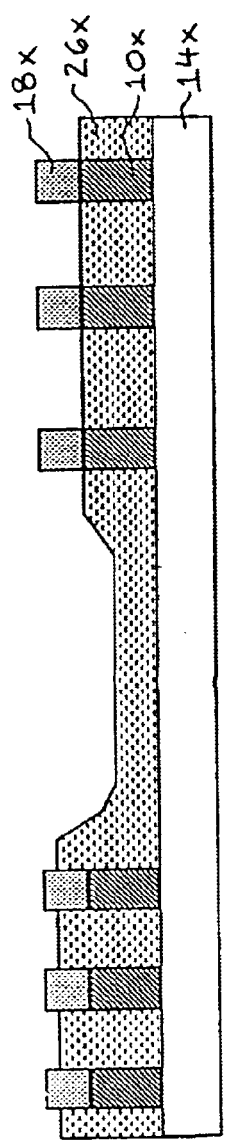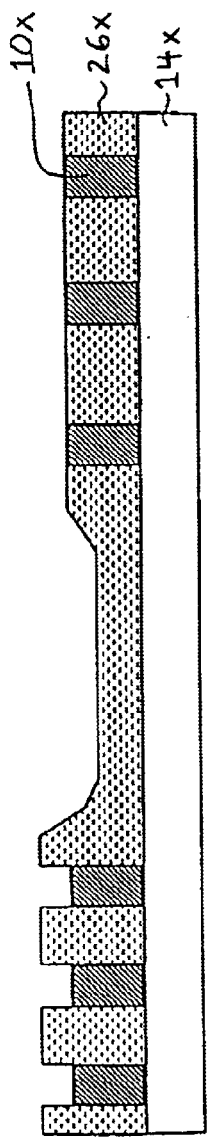
FIG. 3E
FIG. 3F
FIG. 3G

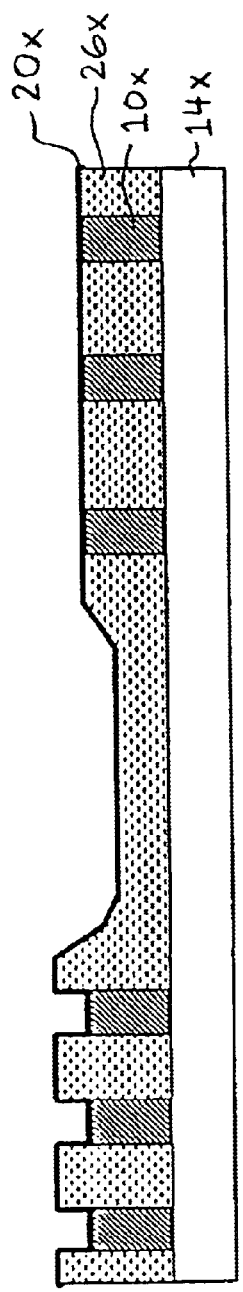
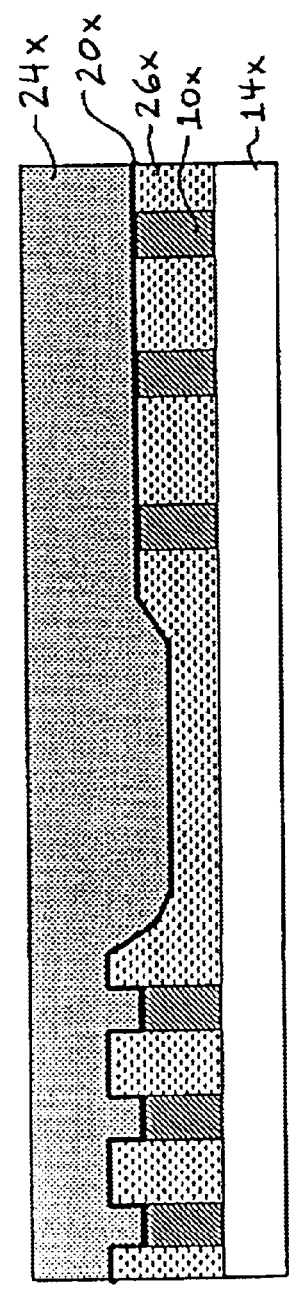
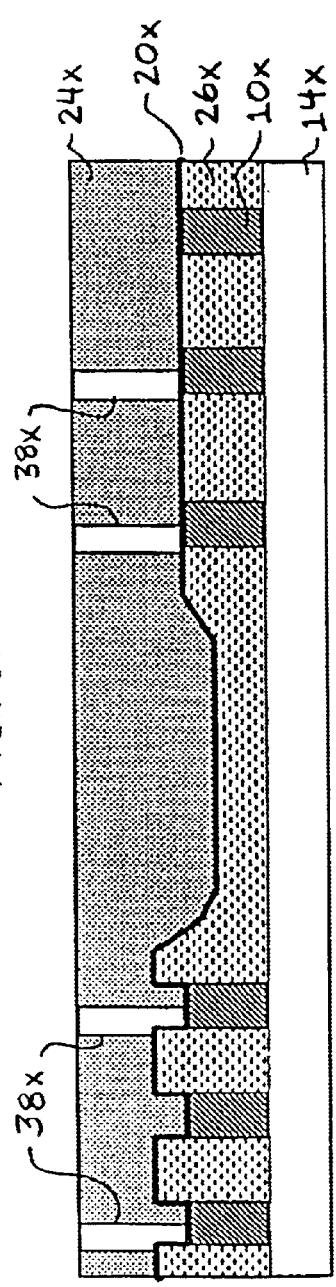
FIG. 3H
FIG. 3I
FIG. 3J

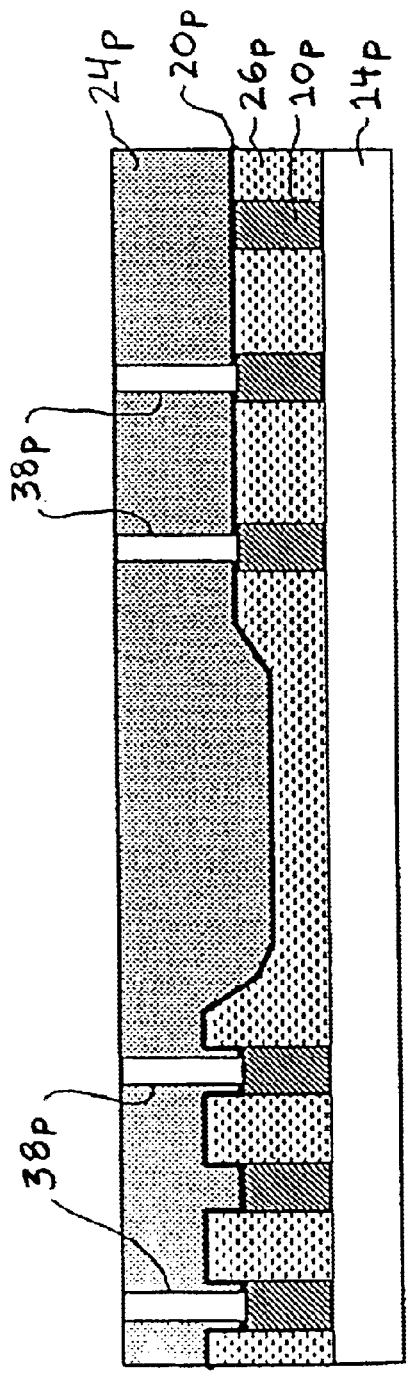
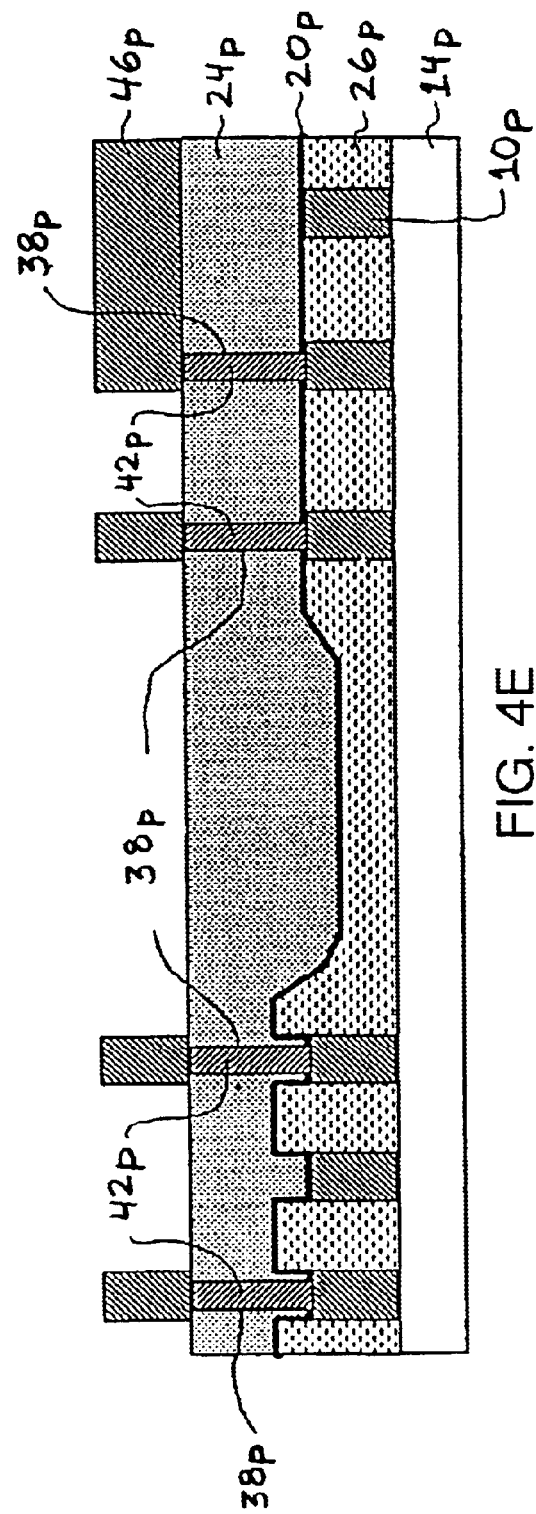
FIG. 4D
FIG. 4E

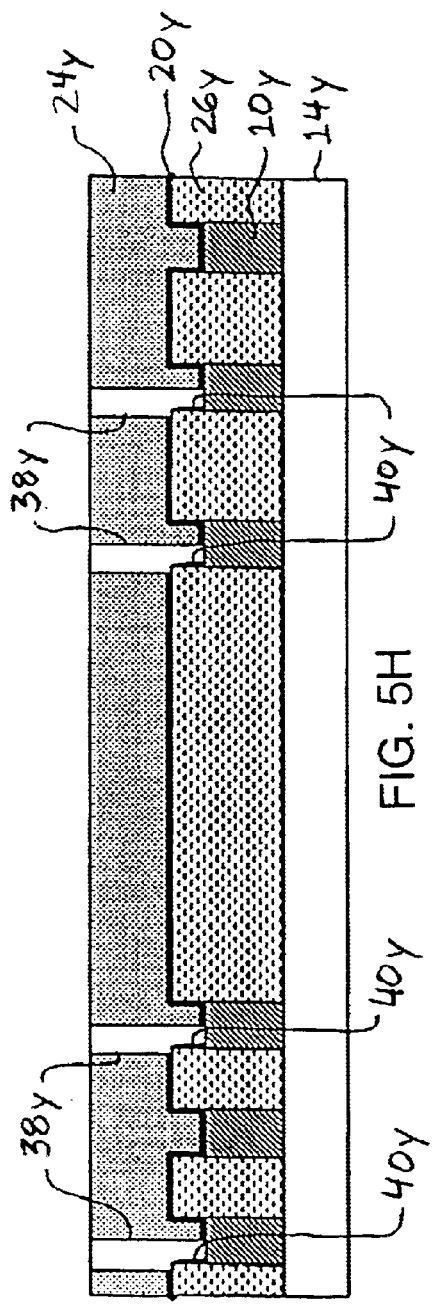
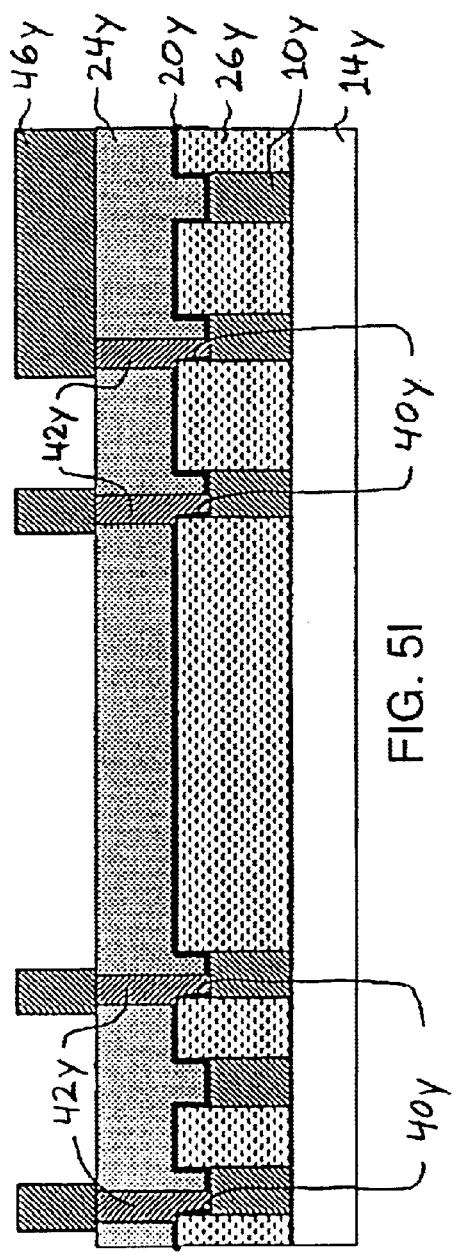
FIG. 5H
FIG. 5I

INTERCONNECT WITH LOW DIELECTRIC CONSTANT INSULATORS FOR SEMICONDUCTOR INTEGRATED CIRCUIT MANUFACTURING

This is a divisional of application Ser. No. 09/158,337 filed on Sep. 22, 1998 now U.S. Pat. No. 6,187,672.

BACKGROUND OF THE INVENTION

1. Field of the Invention

This invention relates generally to semiconductor processing, and more specifically to multi-level interconnects with low dielectric constant insulators and methods for fabricating the same.

2. Background Art

Modern integrated circuits are made up of literally millions of active and passive devices such as transistors, capacitors, and resistors. These devices are initially isolated from one another but are later connected together to form functional circuits through interconnect structures. The quality of the interconnect structure drastically affects the performance and reliability of the fabricated circuit. Interconnects are increasingly determining the limits of performance and density of modem ultra large scale integrated (ULSI) circuits.

Conventional interconnect structures employ one or more metal layers. Each metal layer is typically made from aluminum alloys or tungsten. Interlevel and interlevel dielectrics (ILDs), such as silicon dioxide ($SiO_2$), are used to electrically isolate active elements and different interconnect signal paths from each other. The electrical connections between different interconnect levels are made through vias that are formed in the ILD layers. Typically, the vias are filled with a metal, such as tungsten.

Recently, there has been great interest to replace $SiO_2$ with low-dielectric-constant ("low-k") materials as the ILD in interconnect structures. It is desirable to employ low-k materials as insulators in IC interconnect because these low-k materials reduce the interconnect capacitance. Accordingly, these low-k materials increase the signal propagation speed while reducing cross-talk noise and power dissipation in the interconnect.

However, the use of low-k materials as ILD in the interconnect is not mature at this time, and processes still need to be developed for accommodating the low-k material when forming the interconnect. When forming ILDs entirely out of low-k materials, almost all interconnect processing steps need to be developed, such as the following steps: chemical mechanical polishing (CMP) of the low-k materials, via etch into the low-k ILD layer, post via etch clean, and metal via fill into the low-k ILD layer.

Attempts have been made to provide a process for an embedded low-k dielectric integration approach that employs the low-k dielectric for filling only the gaps between metal lines in the interconnect structure, while still employing conventional $SiO_2$ in the rest of the ILD. U.S. Pat. No. 5,486,493 to Jeng, entitled "Planarized Multievel Interconnect Scheme With Embedded Low-Dielectric Constant Insulators," describes one such approach to embed low-k dielectric in the interconnect structure.

The advantage of this approach is that, since the low-k film is only used to fill the gaps between the metal lines, many of the above-mentioned interconnect processing steps are the steps utilized for conventional $SiO_2$ ILD. This approach attempts to avoid the difficulties associated with (1) having to etch a via through a low-k film; (2) having to make the post-via-etch clean for the low-k film, and (3) having to fill metal through the low-k film for the via plugs.

Unfortunately, these embedded low-k dielectric integration processes suffer from the following disadvantages. For example, ensuring that the level of the low-k material is the same as the top surfaces of the metal or interconnect lines is difficult for at least four reasons. First, in practical manufacturing, it is impossible to deposit a film of low-k material at a precise film thickness from wafer to wafer. Second, even within a wafer, depositing an absolutely uniform low-k film across the same wafer is not possible, since the typical thickness non-uniformity of the low-k film deposited by either spin-on coating or chemical vapor deposition (CVD) using currently-available technology varies by about one to ten percent. Third, even within a given die on a wafer, the gaps between the metal lines are of different sizes, leading to uneven film height of the low-k material above the metal lines. The larger gaps or spacings are filled with more low-k material, thereby lowering the height of the low-k material in these areas. In contrast, the smaller gaps or spacing are filled with less low-k material, thereby raising the height of the low-k material in these areas. Fourth, removing low-k film to the precise thickness during the etch-back is impossible to control in manufacturing.

This difficulty of controlling the deposition and etch-back of the low-k material so that the surface level of the low-k material is the same as the top surfaces of all the metal or interconnect lines results in the following two problems: (1) insufficient-etch-back of the low-k material, which results in a poisoned via and problems associated therewith, and (2) excessive-etch-back of the low-k material, which results in the increase in inter-metal line capacitance and problems associated therewith.

Consequently, applying the correct etch-back amount for the low-k material with the required tolerance (hereinafter referred to as a "process window") is difficult for these proposed processes that embed low-k materials. This problem can be characterized as: "the low-k material etch-back has a very narrow process window." Missing the process window, for whatever reason, results in poor interconnect integrity and reliability, or degradation in interconnect performance.

A conventional method for embedding a low dielectric constant (low-k) material in an interconnect structure involves the following process steps. A first metal layer is deposited on a substrate 1 and patterned to form metal lines 2. Thereafter, a low-k dielectric material 3 is deposited over substrate 1 and metal lines 2. FIG. 1A illustrates a cross-section view of a conventional interconnect structure after the step of depositing the low-k material 3 over substrate 1 and metal lines 2. An etch-back is used to etch the low-k material 3 such that the low-k dielectric material 3 only fills the gaps between metal lines 2 as shown in FIG. 1 B. An $SiO_2$ layer 4 is then deposited and planarized. Via holes 5 are etched in the $SiO_2$ layer 4. Metal plugs 6 are formed in the via holes 5. Thereafter, a second metal layer is deposited on the $SiO_2$ layer 4 and patterned to form metal lines 7. FIG. 1B illustrates a cross sectional view of an ideal conventional embedded low-k interconnect structure after the step of depositing and patterning the second metal layer.

In the ideal case, the low-k dielectric material 3 is isolated from the chemicals utilized to etch and clean the via holes 5 and the chemicals utilized to deposit the metal plugs 6. However, as explained above, the etchback of the low-k material 3, which is critical for this isolation to occur, is difficult to control. Consequently, instead of the ideal case where the low-k material 3 is etched-back exactly at the top level of the metal or interconnect, the more likely case is that either the low-k material 3 is insufficiently etched-back or excessively etched-back.

FIG. 1C illustrates a cross section of a conventional interconnect structure in which the etch-back of the low-k material is insufficient (i.e., the height or level of the low-k dielectric material 3 is higher than the height of the metal lines 2). When the etch-back of the low-k material 3 is insufficient, poisoned vias 8 result. A poisoned via 8 is caused by the exposure of the low-k material 3 to the chemicals that are used in the subsequent via etch, photo-resist strip and wet clean processing steps and that are not compatible with the low-k material 3. The poisoned vias 8 present a serious yield and reliability problem in the conventional embedded look interconnect structures. The poisoned vias 8 lead to high via or contact or even via failure. Specifically, the bowl shape of poisoned vias 8 prevents the formation of a continuous seed layer or liner that is a precursor to filling the vias with plug metals. A discontinuous liner leads to poor metal growth and a poor connection.

FIG. 1D illustrates a cross section of a conventional interconnect structure in which the etch-back of the low-k material 3 is excessive (i.e., the look material is over-etched, exposing the sides 9 of the metal line to oxide). When the etch-back of the low-k material 3 is excessive, the capacitance between metal lines 2 (i.e., the interline capacitance) increases. A higher interline capacitance causes signals to propagate slower through the interconnect Furthermore, the higher inter-line capacitance increases cross-talk noise, which is the unwanted transfer of signals from one metal line to another metal line.

Even if the process window is met for some metal lines, other metal lines may miss the process window. For example, the metal lines that are spaced further apart from each other experience excessive-etch-back of the low-k material i.e., the level of the low-k material in these gaps are lower than the height of the metal lines) because the increased spacings between these metal lines. After the low-k dielectric etch-back, these spacings are only partially filled by the low-k material.

In summary, missing the process window leads to either poor interconnect integrity and reliability or degradation in performance of the circuits. Furthermore, it is very difficult or impossible to embed the low-k materials precisely in the metal gaps of different sizes by the low-k film deposition and the etch-back process. Consequently, the improvement to the overall integrated circuit performance that is provided by the incorporation of low-k material is limited.

FIGS. 2A and 2B illustrate how misalignment of vias 5a (also known as "unlanded vias") can also cause poisoned vias. Even when the process window for the etch-back of the low-k material 3a is met the misalignment of the vias 5a with respect to the underlying metal lines 2a can also cause poisoned vies 8a. Accordingly, it is important in conventional embedded low-k interconnect structures that the vias 5a be properly aligned (also known as "landed vias") to the underlying metal lines 2a in order to isolate the low-k material 3a from the metal plugs 6a. FIGS. 2A and 2B are cross sectional views that illustrate how vias 5a a can be poisoned because of misalignment even when the process window for the etchback of the low-k material 3a is met. As noted earlier, poisoned vias 8a lead to poor plug formation that results in poor contact between the metal layers.

To address this potential misalignment problem, attempts have been made to provide some misalignment tolerance during the manufacturing process. One such approach to achieve the isolation between via plugs 6a from the low-k material 3a is to provide a larger metal area 2a at the vias 5a, thereby providing the needed misalignment tolerance.

However, increasing the metal area causes several disadvantages. First, an increased metal area causes an increased pitch, thereby reducing interconnect density per layer. Since each wafer has a predetermined number of required interconnects, a reduced interconnect density per layer forces a designer to add additional layers of interconnects to meet the required number of interconnects. Adding additional layers of interconnects increases the costs to manufacture the wafer and can also lead to lower yields.

Second, even after the metal area has been increased, special care is still required to ensure that the wafers are processed within the misalignment tolerance provided by the increased metal area. Furthermore, the precautions of increased metal area and special care in processing do not prelude the possibility of a poisoned via resulting from misalignment of the via to the metal.

Accordingly, there remains a need for an interconnect structure and fabrication method that addresses the poisoned via problem that results from misalignment and the disadvantages set forth above.

SUMMARY OF THE INVENTION

An object of the present invention is to provide an interconnect structure and related fabrication process for addressing mis-aligned vias by employing a protective layer.

Another object of the present invention is to provide an interconnect structure and related fabrication process that increases the process window for low-k etcha by using a sacrificial layer.

The objects of the present invention may be accomplished by an improved interconnect that is formed on a semiconductor body and a corresponding fabrication method. A first metal layer is deposited on the semiconductor body. A sacrificial layer having a height is deposited on the first metal layer. Thereafter, the first metal layer and the sacrificial layer are patterned to form metal lines having a sacrificial layer cap that are spaced apart from each other to form gaps therebetween. A low-k material is deposited as an embedded intra-level dielectric (ILD). The height of the sacrificial layer defines, and actually increases, the process window for the etch-back of the low-k material. After the low-k material has been deposited, the low-k material is removed or etched back to a level which is at or within the height of the sacrificial layer. Planarization of the low-k material by CMP processing can also ensure that the process window is not missed. Thereafter, the sacrificial layer is removed, and a protective layer is deposited on the low-k material and the metal lines. A conventional dielectric layer, such as $SiO_2$, is then deposited on the protective layer, and vias are etched therein. A photo-resist (PR) strip and via etch clean are then performed while the protective layer protects the low-k material from attack by chemicals utilized in these process steps. Thereafter, the protective layer is selectively etched so that the via plugs can contact the metal lines. The protective layer helps to shield the via metal from the low-k material.

Other objects and advantages of the present invention will become evident from the detailed description which follows.

BRIEF DESCRIPTION OF THE DRAWINGS

The present invention is illustrated by way of example, and not by way of limitation, in the figures of the accompanying drawings and in which like reference numerals refer to similar elements.

FIGS. 3A–3M are vertical cross sectional views that illustrate selected stages of fabrication of the interconnect structure according to a first embodiment of the present invention for misaligned vias.

FIGS. 4A–4E are vertical cross sectional views that illustrate selected stages of fabrication of the interconnect structure according to the first embodiment of the present invention for perfectly aligned vias.

FIGS. 5A–5I are vertical cross-sectional views that illustrate selected stages of fabrication of the interconnect structure according to a second alternative embodiment of the present invention.

DETAILED DESCRIPTION OF THE INVENTION

Multi-level interconnects with low dielectric constant insulators and methods for fabricating the same are disclosed herein. In the following detailed specification, numerous specific details are set forth, such as materials, thicknesses, processing sequences, etc., in order to provide a thorough understanding of the present invention. However, it will be apparent to one skilled in the art that the present invention may be practiced without some of these specific details. In certain instances, well-known processing steps, device structures, semiconductor manufacturing materials, and equipment have not been described in detail in order to avoid unnecessarily obscuring the present invention.

The present invention is now described in connection with the following three specific embodiments: (1) process utilizing a low-k etchback step for mis-aligned vias and for perfectly aligned vias; (2) process utilizing a low-k polishing step; and (3) process utilizing both a low-k polishing step and a low-k etchback step.

First Embodiment: Process utilizing a Low-k Etchback Step (Mis-aligned Vias)

Figure 1A:
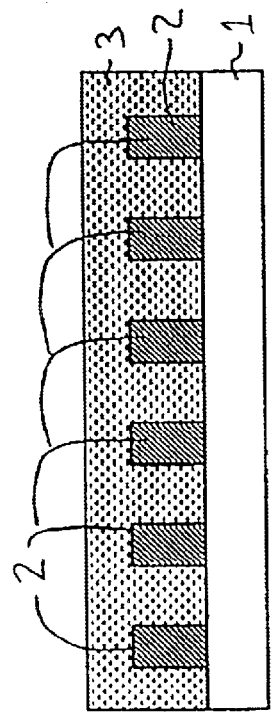
FIGS. 1A–1D illustrate conventional interconnect structures that embed low dielectric constant (low-k) material and the associated problems stemming from etch and over-etch of the low-k material.
Figure 1B:
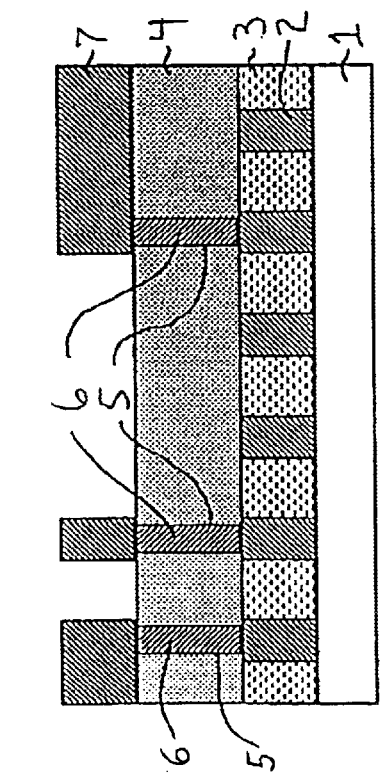
Figure 1C:
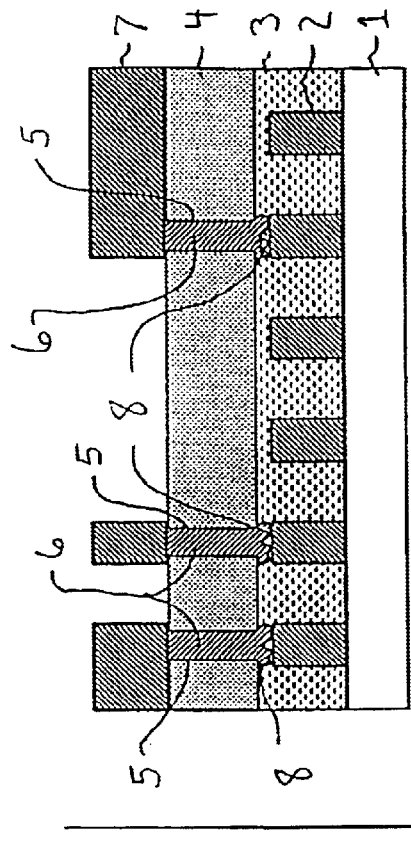
Figure 1D:
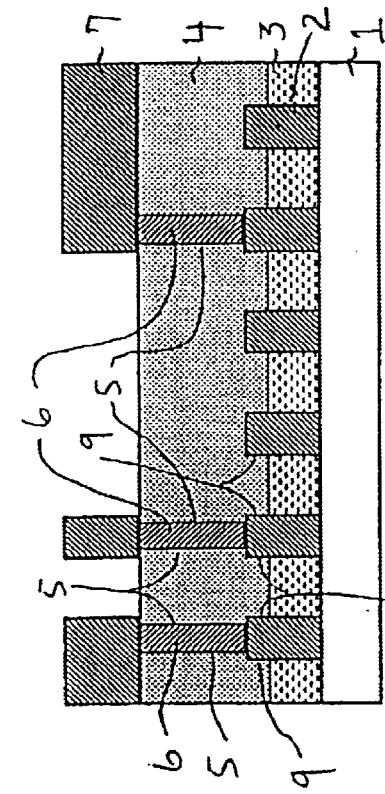
Figure 2A:
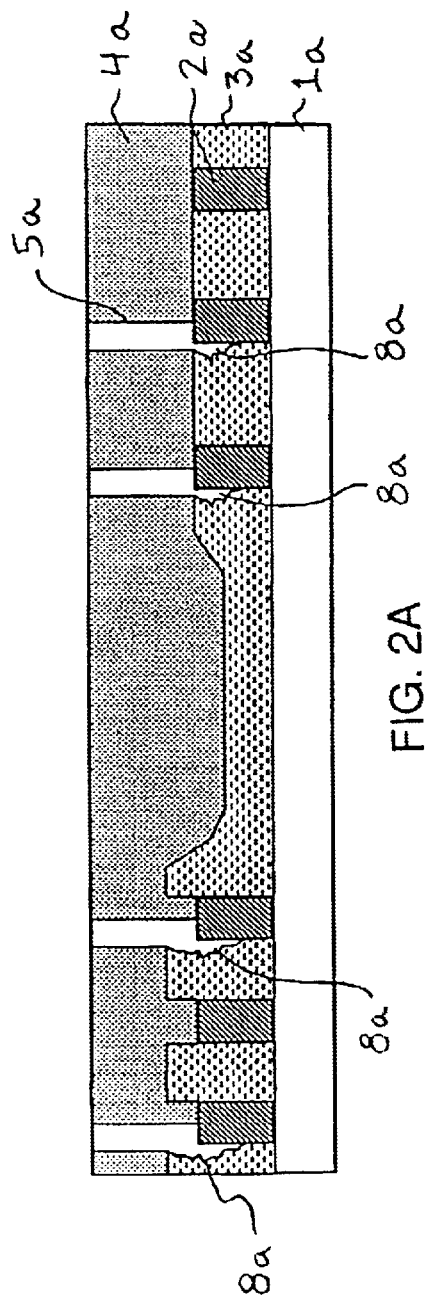
FIGS. 2A and 2B illustrate how vies can be poisoned because of misalignment of vias with the metal lines.
Figure 2B:
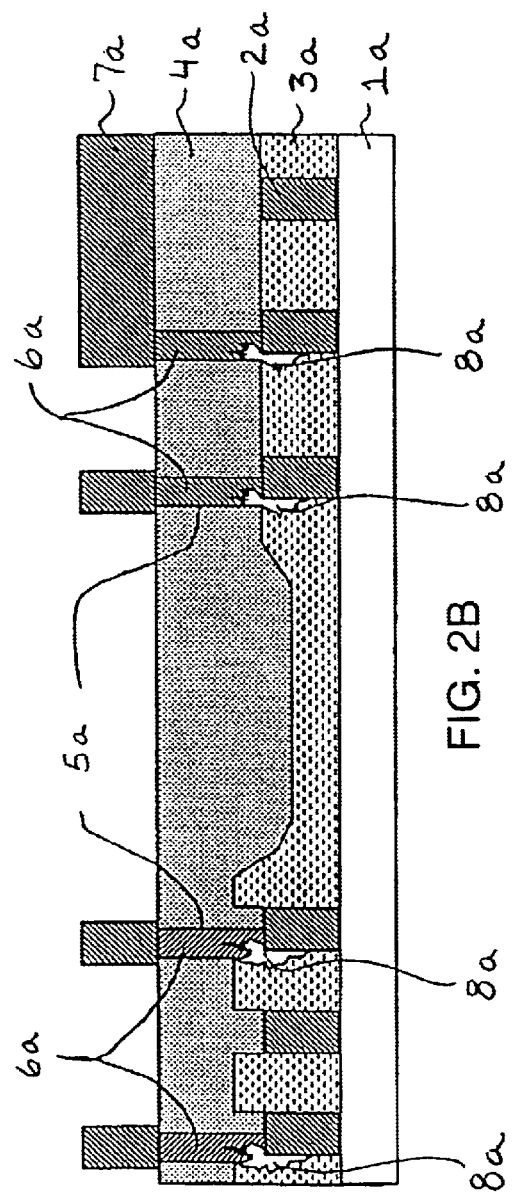
Figure 3A:
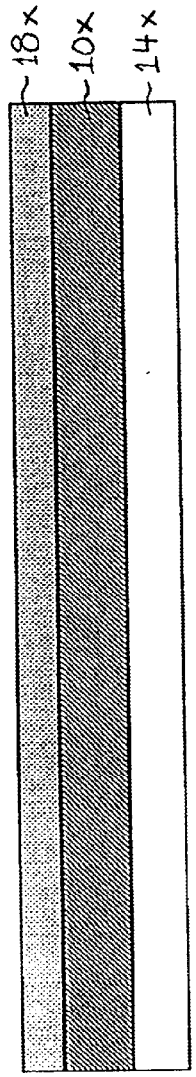

FIGS. 3A–3M are vertical cross sectional views, illustrating selected stages of fabrication of the interconnect structure according to a first embodiment of the present invention. Referring to FIG. 3A, a first metal layer $10x$ is deposited on a substrate $14x$. First metal layer $10x$ can be any conductive material, such as polysilicon, TiN, Ti. Al, Al-alloy, TaN, Cu, Ta, or the combination of the above. The substrate $14x$ can contain silicon devices and previously-formed interconnect structures. A sacrificial layer (SL) $18x$ is deposited on the first metal layer $10x$ according to methods known in the art. The sacrificial layer (SL) $18x$ can be an insulating or conductive material that is chemically different from metal layer $10x$ and a low-k material $26x$ that is later deposited (as described below), and can include but is not limited to silicon dioxide ($SiO_2$), silicon nitride (SiN), aluminum oxide ($Al_2O_3$), silicon carbide (SiC), polymers, or other organic materials. Sacrificial layer (SL) $18x$ can include a conductive material such as titanium, titanium nitride, tungsten, tungsten nitride, or poly-silicon. In the preferred embodiment, the sacrificial layer SL $18x$ can be $SiO_2$ deposited by plasma enhanced chemical vapor deposition (PECVD), and the height or thickness of sacrificial layer $18x$ is preferably between 300 to 5000 Angstroms to provide a sufficiently large process window.

Figure 3B:
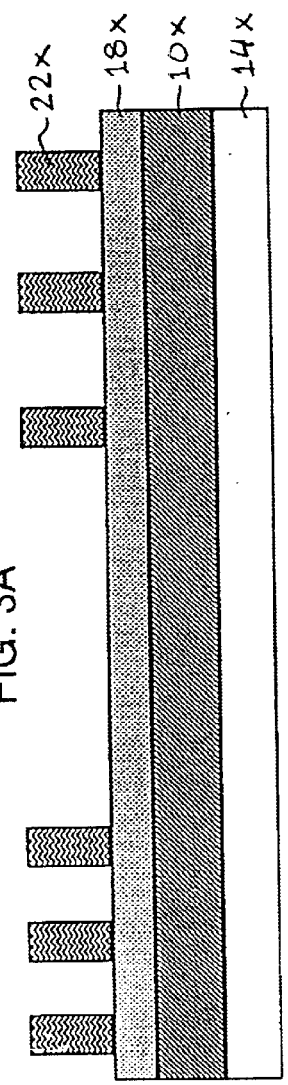
Figure 3C:
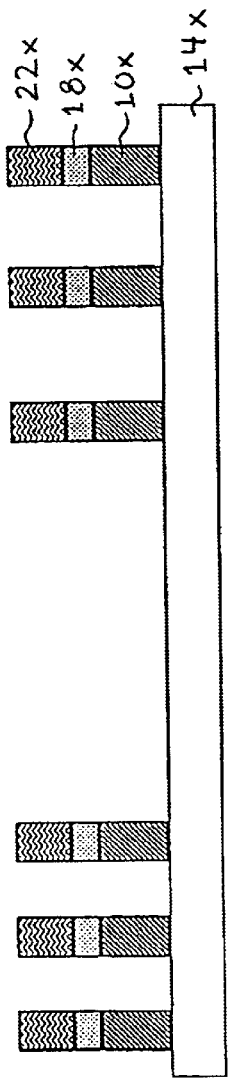
Figure 3D:
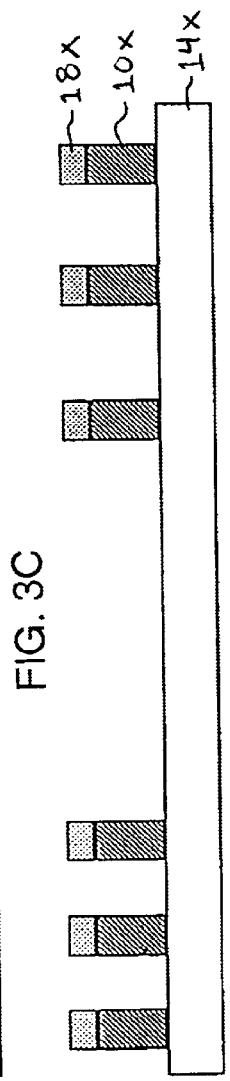

Referring to FIG. 3B, a photoresist is coated, exposed and ten developed into an interconnect wiring pattern $22x$ in FIG. 3C, the sacrificial layer $18x$ and metal layer $10x$ are formed into the same configuration as the interconnect wiring pattern $22x$ by an etch process, such as a plasma etch. As shown in FIG. 3D, photoresist stripping and wet clean steps are performed to leave metal or interconnect lines $10x$ with a sacrificial cap layer $18x$.

Referring to FIG. 3E, a low-k material $26x$ is deposited on the substrate $14x$, metal lines $10x$, and sacrificial layer $18x$ by chemical vapor deposition (CVD), or by spin-on coating followed by curing. The low-k material $26x$ can be made from a material which is chemically different from the material of the sacrificial layer $18x$, and preferably has a dielectric constant of less than four. In the preferred embodiment, the height or thickness of look material $26x$ is preferably between 3000 Angstroms to 20,000 Angstroms.

Non-limiting examples of the low-k material $26x$ include doped or non-doped $SiO_2$, polyimides, silsesquioxanes, fluorinated polyimides, parylene, tluoro-polymers, poly (arylethers), fluorinated-poly(arylethers), porous-polymer/polyimide, polytetrafluoroethylene, and porous silica (also known as Aerogel and Xerogel).

In addition, those skilled in the art will appreciate that if thick low-k films $26x$ are to be provided, multiple coatings and curing of the low-k film $26x$ may be needed if the low-k material $26x$ is to be deposited by a spin-on coating process.

Referring to FIG. 3F, low-k material $26x$ is removed by an etch-back process step that leaves the low-k surface level somewhere within the height of the patterned sacrificial layer $18x$ (i.e., at a height that is greater than or equal to the height of the metal line and less than or equal to the height of the metal lines plus the height of sacrificial layer $18x$) in the closely-spaced metal lines. The low-k etchback can be accomplished by conventional methods. For example, a plasma etch having an etch rate of low-k material $26x$ that is faster than the etch rate of sacrificial layer $18x$ can be utilized. In a preferred embodiment, the low-k material is organic material and it can be etched, by oxygen-based plasma.

The present invention employs the sacrificial layer $18x$ to allow both the closely spaced apart metal lines and the further spaced metal lines to meet the low-k material process window. The low-k material $26x$ has different heights or levels depending on the distance between the metal lines or the metal line density. For example, the level of the low-k material $26x$ is higher at the region of the metal lines $10x$ which are closely spaced, and the level of the low-k material $26$ is lower at the region of the metal lines $10x$ which are less closely spaced, and the level of the low-k material $26x$ is even lower at the region between the metal lines lox which are spaced-apart from each other by a much larger spacing. Thus, the sacrificial layer $18x$ atop the metal lines $10x$ increases the process window. Alternatively, as described below, instead of a low-k etchback, a CMP process can be used to polish back the low-k material $26x$.

Referring to FIG. 3G, the sacrificial layer 18x is removed by employing an etchback (e.g., a carbon-fluorine-based plasma etch if layer 18x is silicon dioxide). This etch is selective in that the etch chemistry removes the sacrificial layer 18x without attacking the dielectric layer 26x and metal lines 10x. Referring to FIG. 3H, a protective layer 20x is deposited on the low-k material 26x and the metal lines 10x. The protective layer 20x can be a dielectric material such as a silicon nitride layer or a silicon carbon layer. Preferably, protective layer 20x is chemically different than dielectric layer 24x, which is deposited hereinafter. In the preferred embodiment, the height or thickness of protective layer 20x is preferably between 50 Angstroms to 1000 Angstroms. Referring to FIG. 3I, a conventional dielectric layer 24x, such as a $SiO_2$ layer, is deposited and planarized. Dielectric layer 24x can also include silicon carbon (SiC), aluminum oxide ($Al_2O_3$), or other insulators which are preferably chemically different from protective layer 20x.

It is important that there is good etch selectivity between protective layer 20x and second insulator layer 24x in the preferred embodiment, the height or thickness of dielectric layer 24x after the planarization (e.g. by CMP) is preferably between 3000 Angstroms to 20,000 Angstroms above the metal lines 10x.

Referring to FIG. 3J, a via pattern is transferred to the wafer by conventional photolithography and plasma etch. An etch chemistry is utilized to etch vias through dielectric layer 24x. The etch stops at protective layer 20x. With protective layer 20x in place to protect low-k material 26x, conventional processing steps, such as photo-resist strip and post-via etch clean using solvents, can be performed. Protective layer 20x protects low-k material 26x from the chemicals utilized in the etch strip and wet clean process steps. Once all desired processing for the vias has been completed, a soft etch is performed to selectively remove protective layer 20x inside the via holes as is described in greater detail hereinafter with reference to FIGS. 3K, 3L. 7A and 7B.

Figure 3K:
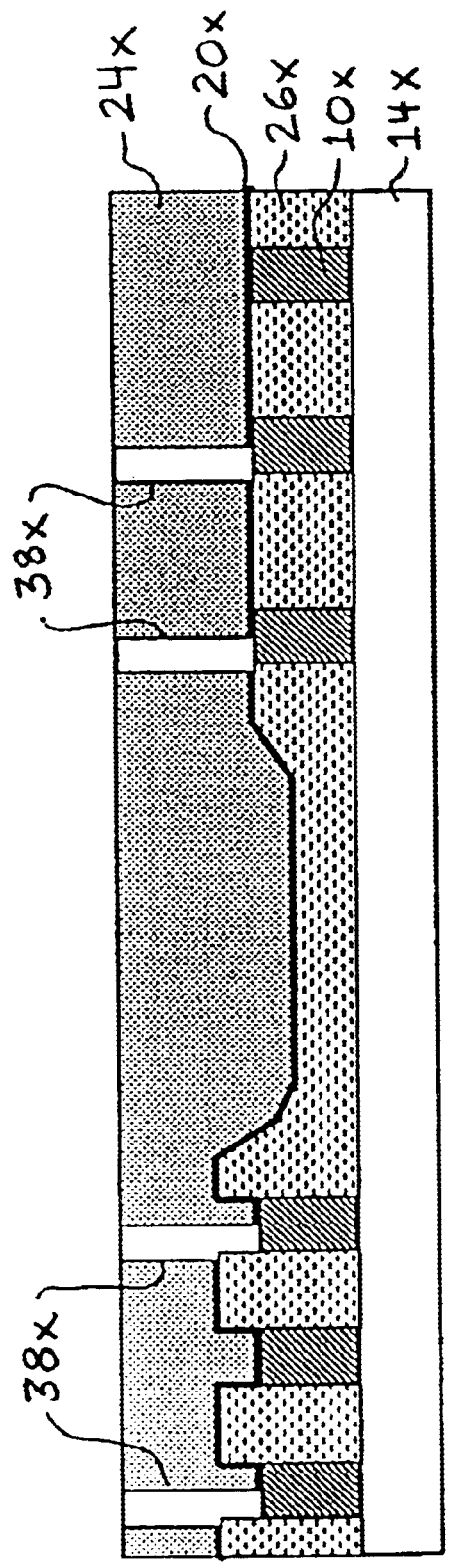

In one embodiment, referring to FIG. 3K, after vias have been etched through dielectric layer 24x and cleaned, both horizontal portions and vertical portions of protective layer 20x inside the via holes are removed by an isotropic etch. It is desirable that the etch chemistry utilized to remove protective layer 20x provides good etch selectivity between protective layer 20x and metal lines 10x, between protective layer 20x and low-k material 26x (i.e., the etch chemistry attacks protective layer 20x at a much faster rate than it attacks metal lines 10x and low-k material 26x), and between protective layer 20x and dielectric layer 24x.

Figure 7B:
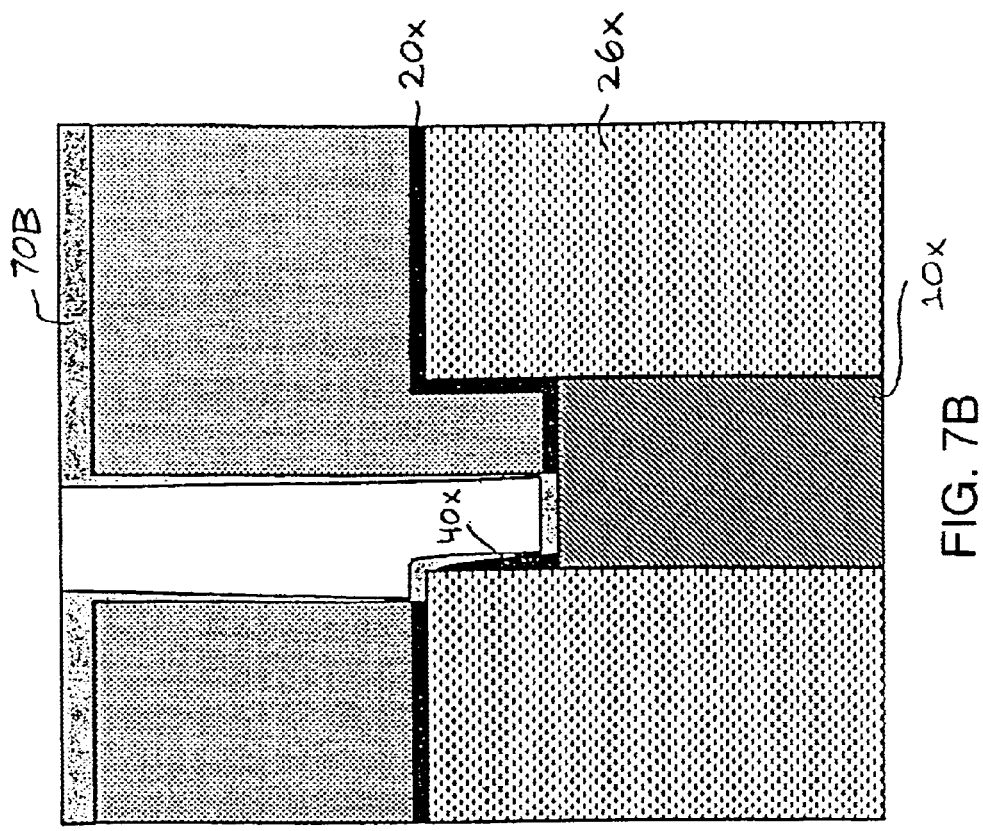
FIG. 7B is a cross-sectional view of a via having a spacer after the step of depositing a barrier/seed layer.
Figure 7A:
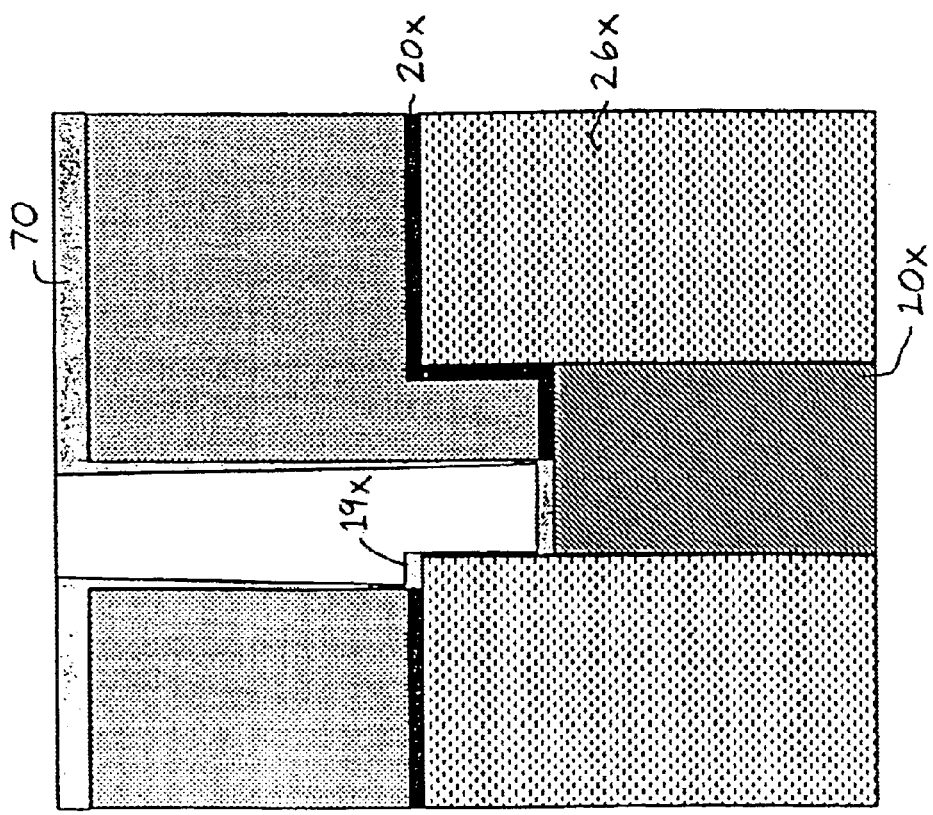
FIG. 7A is a cross-sectional view of a via without a spacer after the step of depositing a barrier/seed layer.

As can be seen in FIG. 7A, when an isotropic etch is utilized, all horizontal portions and vertical portions of protective layer 20x are removed so that a liner 70 can contact the top surface of metal lines 10x, the vertical (i.e., sidewalk) portion of low-k material 26x, and a horizontal (i.e., the top horizontal surface 19x of the low-k material 26x) portion of low-k material 26x. When vias 38x are filled with conductive plugs, the plugs can contact the metal lines 10x Metal plugs are formed by a conductive material (e.g., tungsten, copper or aluminum). The liner 70 is a precursor for plug metal deposition. An isotropic etch can be utilized if the liner 70 is deposited by a CVD technique which provides better sidewall and horizontal coverage.

Figure 3L:
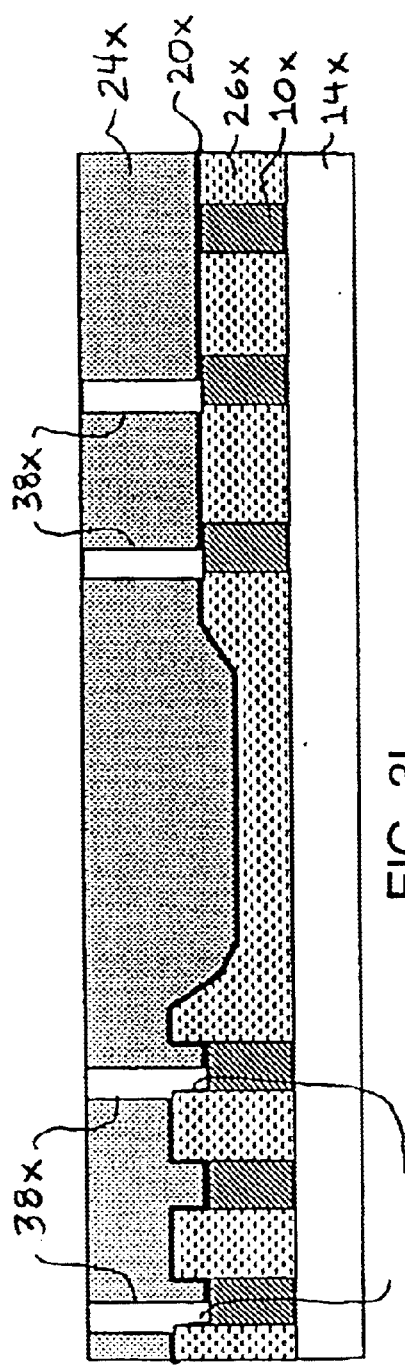

In an alternative embodiment, referring to FIG. 3L, after the vias 38x have been etched through dielectric layer 24x and cleaned, only the horizontal portions (also referred to as bottom coverage) of protective layer 20x inside the via holes are selectively removed by an-isotropic etch. As can be seen in FIGS. 3L and 7B, when an-isotropic etch is utilized, only the horizontal portions of protective layer 20x inside the via holes are removed, and a spacer 40x remains. For example, a silicon nitride (SiN) spacer can be left on the vertical portions of the exposed low-k material 26x. After the etch of protective layer 20x, liner 70, 70B (commonly known also as a "seed", "adhesions", or "barriers" layer) is deposited in the vias to prepare for the deposition of plug metal in the vias. When compared with FIG. 7A, the presence of the vertical spacer section 40x decreases the cross-sectional area of contact plug and increases the via resistance. Under 70, 70B (shown in FIGS. 7A and 7B) can include titanium, titanium nitride, tantalum, tantalum nitride, aluminum, copper, tungsten nitride, or a combination thereof in a stack structure.

For improved step coverage, liner 70 can be deposited by collimated, ionized metal plasma (IMP) or hollow cathode magnetron (HCM) sputtering deposition. Although the bottom coverage can be significantly improved, the sidewall coverage improvement is still limited for these techniques for features having a high aspect ratio as shown in FIG. 7A. Preferably, a spacer 40x is left in the vias. Leaving a spacer 40x improves the sidewall coverage of liner 70 because of the shape of the spacer. Improving the sidewall coverage (1) improves the metal growth and deposition of the metal plug, which leads to lower resistance; and (2) improves the isolation between the low-k material 26x and the plug metal 42x as shown in FIG. 7B. Isolation of the plug metal 42x from low-k material 26x can be important if the low-k material 26x is corrosive to the metal utilized for plug 42x. Even if the low-k material 26x is not corrosive to the metal utilized for plug 42x, certain metals, such as copper, can diffuse into the low-k material 26x, which is an undesirable result, if sidewall coverage is poor.

Figure 3M:
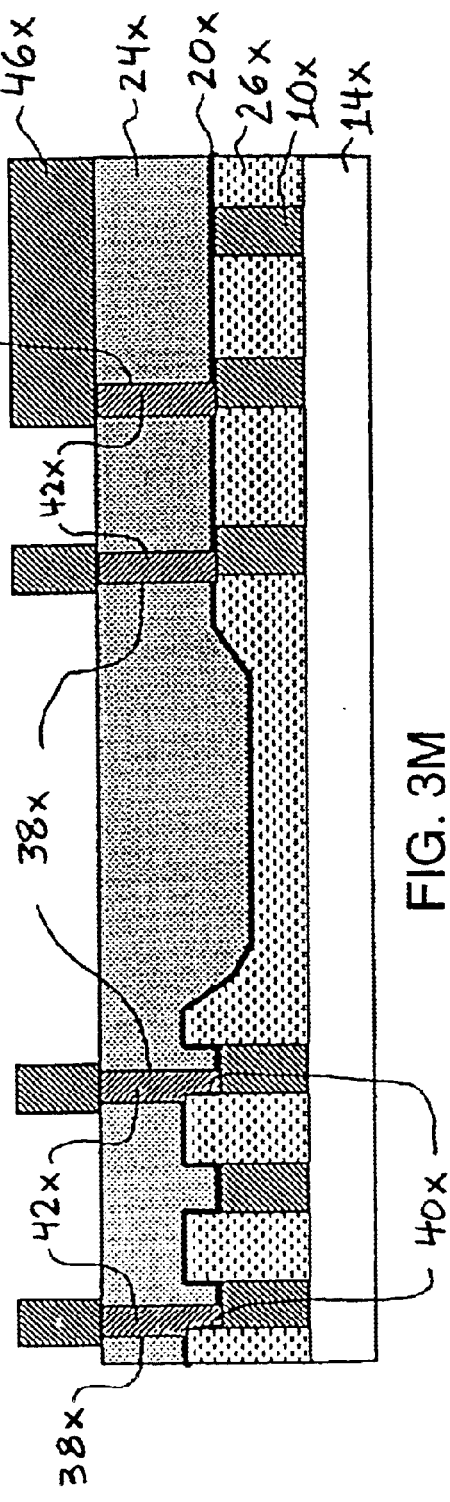

FIG. 3M illustrates the interconnect structure after metal plugs 42x are formed in the via holes 38x inside the insulator layer 24x according to techniques described hereinabove, and a second metal wiring layer 46x is fabricated, again according to methods known in the art. Plug 42x and second metal layer 46x can be deposited in two separate process steps (i.e., tungsten deposition for forming the plug 42x followed by alloy deposition for the metal layer 46x) or as a single process step (i.e., depositing aluminum or other alloy to fill the via 38x and to form the metal layer 46x at the same time).

Thus, the above-described poisoned via problems can be avoided by the provision and subsequent removal of a sacrificial layer 18x and a portion of protective layer 20x.

For misaligned vias, protective layer 20x isolates low-k material 26x from process chemicals that can cause poisoned vias. The protective layer 20x protects the low-k material 26x from chemicals and other process elements used in the via etch, photoresist strip, and via wet clean processing steps. Spacer 40x improves liner sidewall coverage for better plug metal growth and deposition. Furthermore, spacer 40x improves isolation of low-k material 26x and plug metal 42x for better reliability.

First Embodiment: Process Utilizing a Low-k Etchback Step (Perfectly Aligned Vias)

Figure 4A:
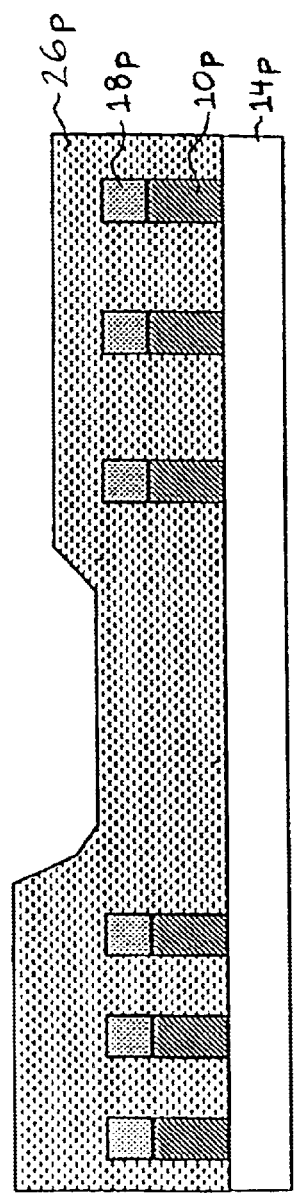

FIGS. 4A–AE are vertical cross-sectional views that illustrate selected stages of fabrication of the interconnect structure according to the first embodiment of the present invention where perfect alignment between via and metal line can be obtained. Referring to FIG. 4A, a substrate 14p is provided. Substrate 14p may, for example, include transistors, diodes, and other integrated circuit elements (not shown). A first metal layer 10p is deposited over substrate 14p. Metal layer 10p can include electrically conducting material, such as aluminum, titanium, or titanium-nitride, although other conductive material can be employed. Sacrificial layer 18p is deposited on first metal layer 10p. Sacrificial layer 18p includes a height that is used to increase the process window for low-k material 26p etch-back as described previously.

First metal layer 10p and sacrificial layer 18p are patterned to form metal lines each having a sacrificial layer cap. Thereafter, a low-k material 26p is deposited to fill the gaps between the metal lines.

Figure 4B:
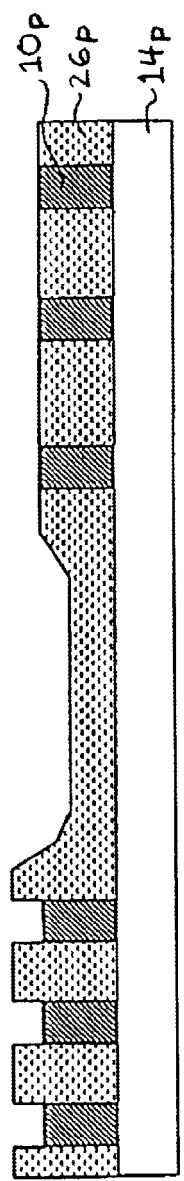
Figure 4C:
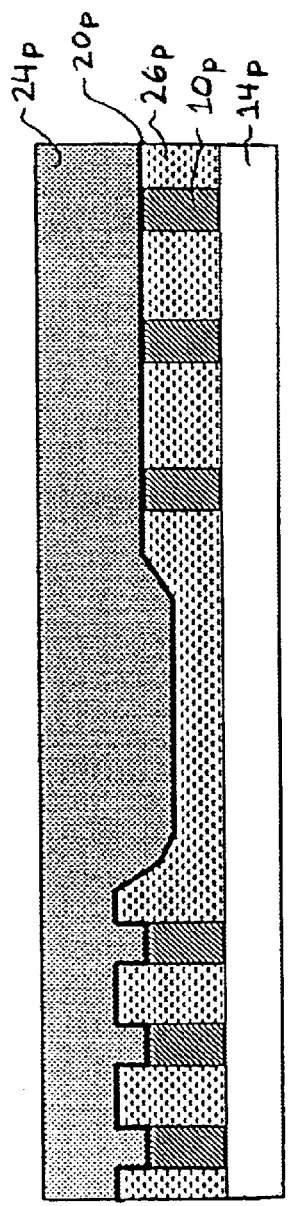

Referring to FIG. 4B, low-k material 26p is removed by an etchback process step. Low-k material 26p is etchedback to a height within the height of sacrificial layer 18p (i.e., at a height that is greater than or equal to the height of the metal line 10p and less than or equal to the combined height of the metal line 10p and the sacrificial layer). The sacrificial layer 18p is removed by employing an etch-back (e.g., a carbon-fluorinebased plasma etch if layer 18p is silicon dioxide). This etch is selective in that the etch chemistry removes the sacrificial layer 18p without attacking the dielectric layer 26p and metal lines 10p. Referring to FIG. 4C, a protective layer 20p is deposited to cover the metal lines 10p and the low-k material 26p. An insulative layer (e.g., a dielectric) 24p is also deposited over protective layer 20p and planarized by a CMP process step.

Referring to FIG. 4D, vias 38p are etched into insulative layer 24p. In this case, the vias 38p are perfectly aligned with the metal lines. A dean step is then performed for the vias 38p. An opening is formed in protective layer 20p using the techniques described above so that a metal, which is deposited in the vias 38p in a subsequent process step, can contact the first metal layer 10p. Liners can also be provided in the vias 38p. Referring to FIG. 4E, vias 38p are filled with metal plugs 42p. Thereafter, a second metal layer 46p is deposited and patterned on insulative layer 24p.

Second Embodiment: Utilizing Low-k Polish Step Instead of Low-k Etch Step

Figure 5A:
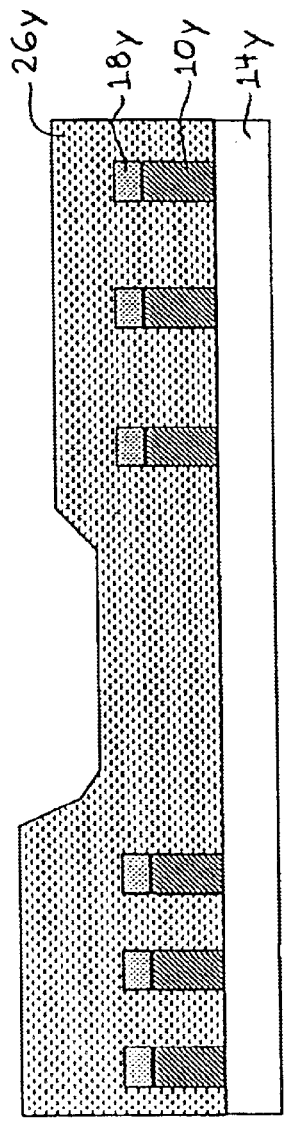
Figure 5B:
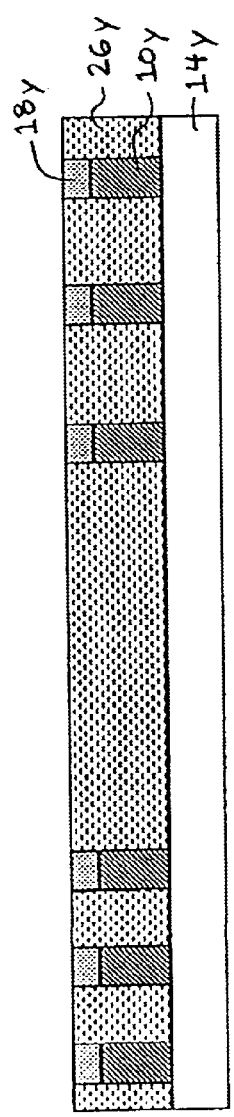
Figure 5C:
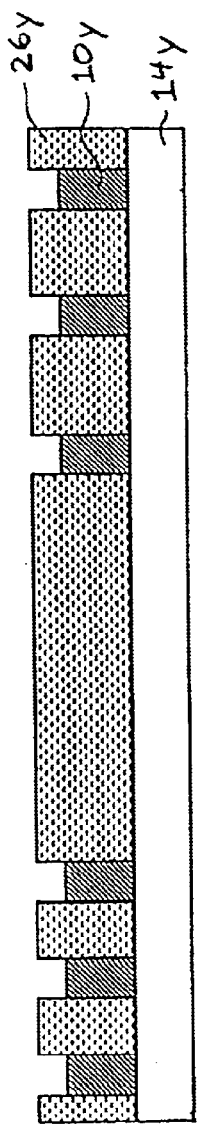
Figure 5D:
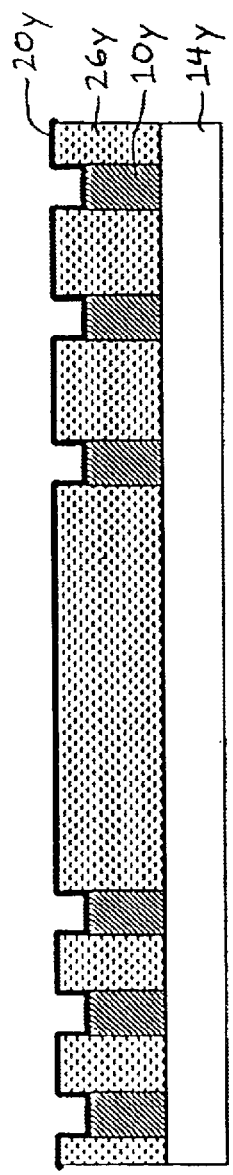
Figure 5E:
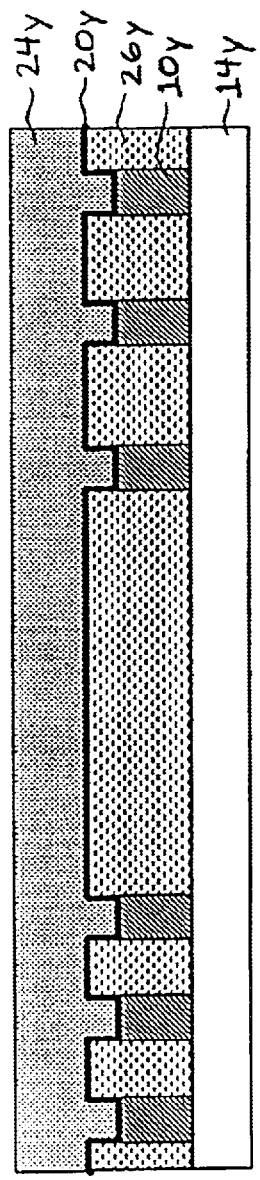
Figure 5F:
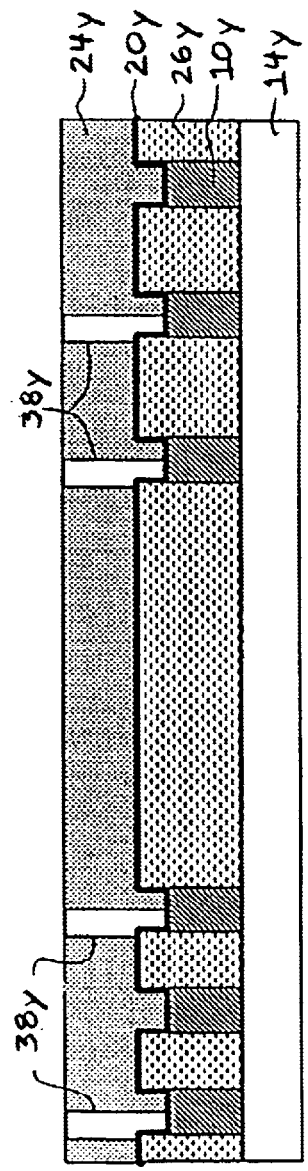
Figure 5G:
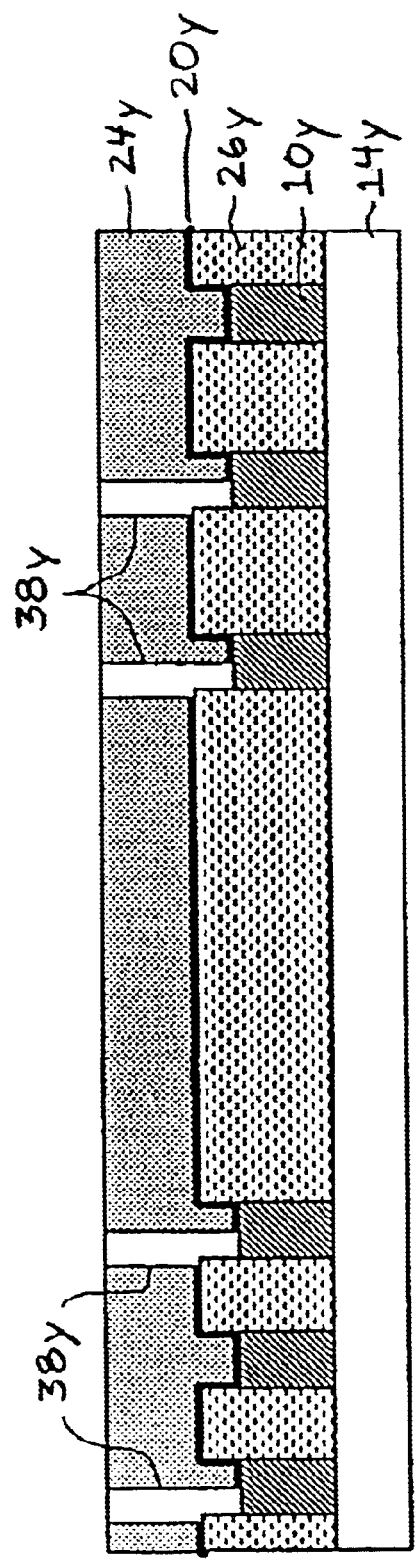

FIGS. 5A–5H are vertical cross-sectional views that illustrate selected stages of fabrication of the interconnect structure according to a second embodiment of the present invention. FIG. 5A is a vertical cross-sectional view of the interconnect structure after the processing steps illustrated in FIGS. 3A–3E (i.e., after metal layer 10y and sacrificial layer 18y have been deposited on substrate 14y and patterned, and low-k material 26y has been deposited to fill gaps between metal lines 10y and to cover sacrificial layer 18y ). Referring back to FIG. 5B, look material 26y is removed by a chemical mechanical polish (CMP) process step.

For the sake of brevity, since FIGS. 5C–5l correspond generally to FIGS. 3G–3M, the description of FIGS. 3G–3M, 7A, and 7B as they relate to FIGS. 5C–5l will not be repeated herein. Instead, it is noted that the interconnect structure differs from that of the second embodiment in the following ways: (1) low-k material 26y is polished instead of etched-back; and (2) because of the planarization caused by the CMP, low-k material 26y has a height that is about the same in both the areas having the closely-spaced metal lines Joy and the areas having lines 10y that are spaced further apart

Figure 6A:
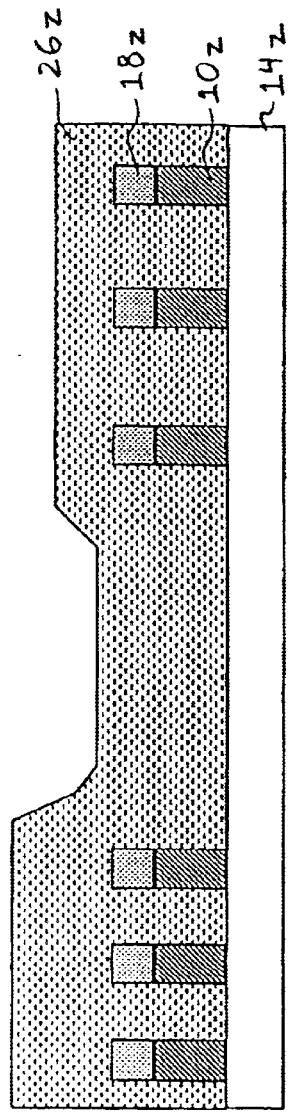
FIGS. 6A–6D are vertical cross-sectional views that illustrate selected stages of fabrication of the interconnect structure according to a third alternative embodiment of the present invention.
Figure 6B:
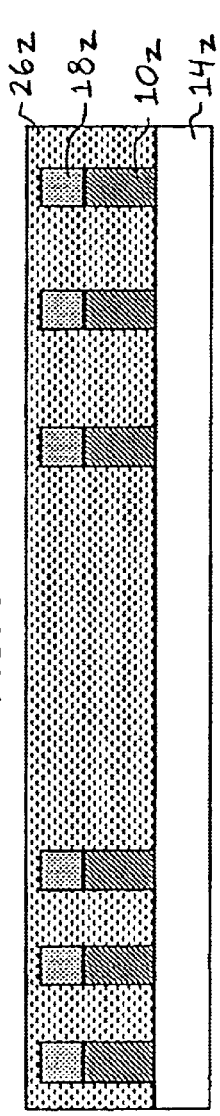
Figure 6C:
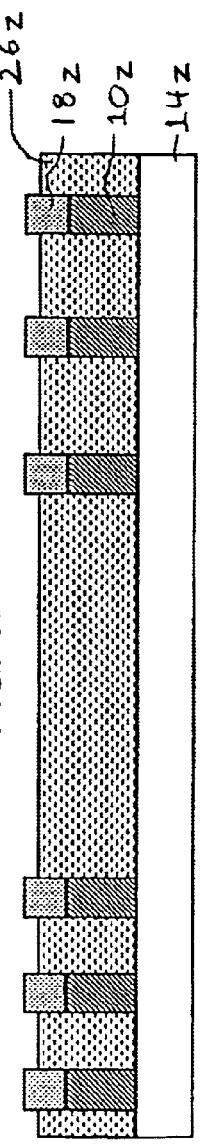
Figure 6D:
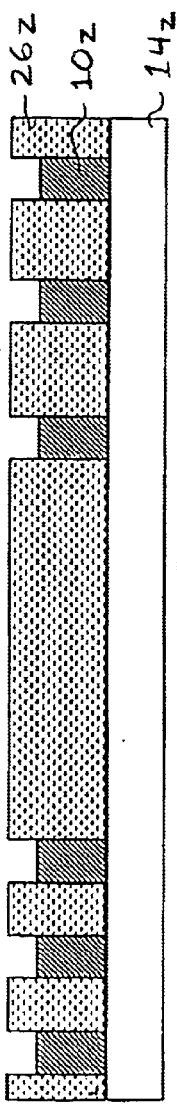

Third Embodiment: Process Utilizing Both a Low-K Planarization Step and a Low-K Etch-Back Step FIGS. 6A–6D are vertical cross-sectional views that illustrate selected stages of fabrication of the interconnect structure according to a third embodiment of the present invention. FIG. 6A is a vertical cross-sectional view of the interconnect structure after the processing steps illustrated in FIGS. 3A–3E, (i.e., after metal layer 10z and sacrificial layer 18z have been deposited on substrate 14z and patterned, and look material 26z has been deposited to cover substrate 14z and gap fill metal layer 10z and sacrificial layer 18z). Referring to FIG. 6B, low-k material 26z is removed by a CMP process step to a level that is higher than the sacrificial layer 18z. Referring to FIG. 6C, low-k material 26z is further removed by an etch-back process, such as by plasma etch. Referring to FIG. 6D, sacrificial layer 18z is then removed.

The processing steps in this embodiment that occur after FIG. 6D correspond generally to FIGS. 3H–3M and FIGS. 5D–5l previously illustrated and described for the first and second embodiments, respectively. For the sake of brevity, these previously described structures and process steps will not be described further herein. It is noted hat the interconnect structure of this embodiment is structurally the same as the second embodiment, and reference is made to FIGS. 5D–5H, 7A and 7B. The difference between the second and third embodiments is in the extra process step of etch-back after the chemical mechanical polish (CMP) step. The present embodiment is especially suited for the scenario where polishing organic low-k materials is difficult to accomplish, since the etchback step following the initial polishing step will remove the surface defects generated in the low-k material polishing step.

Although the structure and processes of the present invention have been described in connection with one metal interconnect layer, the procession described herein can be used in the formation of a plurality of metal interconnect layers.

The present invention provides robust and manufacturable low-k dielectric interconnect processes and corresponding structures. A sacrificial layer, embodying the metal pattern, is fabricated on top of the metal before the low-k dielectric is deposited onto the wafer. The sacrificial layer increases the final thickness of the low-k material after the low-k dielectric etch-back or CMP. An increase in the low-k material between the metal gaps leads to lower interline capacitance, improving performance of the circuits. Furthermore, the processes of the present invention do not require an additional mask/lithography step, and as discussed previously, increases the process window for the low-k dielectric process. The protective layer isolates the low-k material from the chemicals that are employed to etch and clean the vias so that poisoned via problems can be avoided. The spacer can improve liner step coverage for better plug metal fill and improve isolation between the low-k material from the metal plug in certain scenarios thereby improving process robustness and reliability of the interconnect.

It will be recognized that the above described invention may be embodied in other specific forms without departing from the spirit or essential characteristics of the disclosure. Thus, it is understood that the invention is not to be limited by the foregoing illustrative details, but rather is to be defined by the appended claims.

What is claimed is:

1. An interconnect comprising:
    (a) one or more metal lines formed from a first metal layer, said metal lines having gaps therebetween;
    (b) low-k material filling all of the gaps between the metal lines and having at least one vertical portions, said at least one vertical portion of said low-k material extending above said metal lines;

(c) a protective layer formed directly over and in direct contact with the metal lines and the low-k material, wherein the protective layer covers said at least one vertical portion of the low-k material;

(d) a dielectric layer formed over the protective layer, wherein the dielectric layer has a different composition than the low-k material and the protective layer;

(e) one or more vias etched in the dielectric layer;

(f) a metal for filling the vias;

(g) a second metal layer formed over the dielectric layer; and (h) one or more openings in the protective layer for allowing the metal vias to contact the first metal lines.

2. The interconnect of claim 1, wherein the protective layer includes an oxide.

3. The interconnect of claim 2, wherein the oxide includes silicon dioxide.

4. The interconnect of claim 1, wherein the protective layer includes a dielectric material.

5. The interconnect of claim 4, wherein the protective layer includes silicon nitride.

6. The interconnect of claim 1, wherein the protective layer includes silicon carbide.

7. The interconnect of claim 1, further comprising a spacer disposed on said at least one vertical portion of the low-k material.

8. The interconnect of claim 1, wherein the protective layer is silicon-nitride.

9. The interconnect of claim 1, wherein the first metal layer is an aluminum alloy, the metal filling the vias is tungsten, and the second metal layer is an aluminum alloy.

10. The interconnect of claim 1, wherein the first metal layer is an aluminum alloy, the metal filling the vias is an aluminum alloy, and the second metal layer is an aluminum alloy.

11. The interconnect of claim 1, wherein the dielectric layer is made of silicon dioxide, the protective layer is silicon nitride, and the low-k material is an organic low-k material.

12. The interconnect of claim 1, wherein the dielectric layer is made of silicon dioxide, the protective layer is silicon nitride, and the low-k material is a porous silicon dioxide.

13. An interconnect structure comprising:

a plurality of metal lines formed on a substrate;

low-k dielectric structures interposed between two or more of said metal lines;

a second dielectric material formed above said metal lines, wherein portions of said second dielectric material are formed between portions of said low-k dielectric structures;

a protective layer interposed between said low-k dielectric structures and said second dielectric material, wherein said protective layer is configured to provide etch selectivity between said protective layer and said second dielectric material; and a conductive feature formed within said second dielectric material and said protective layer, said conductive feature in contact with at least one of said plurality of metal lines.

14. The interconnect structure according to claim 13, wherein said protective layer includes dielectric material.

15. The interconnect structure according to claim 13, further comprising a liner disposed within a feature formed within said second dielectric material.

16. The interconnect structure according to claim 15, wherein said liner comprises a material selected from the group consisting of titanium, titanium nitride, tantalum, tantalum nitride, aluminum, copper, and tungsten nitride.

17. The interconnect structure according to claim 13, further comprising a spacer interposed between said low-k material and said conductive feature.

18. The interconnect structure according to claim 13, further comprising a spacer interposed between said low-k material and a liner.

19. An interconnect comprising:

(a) a plurality of metal lines formed a first metal layer, said metal lines having gaps therebetween;

(b) material filling all of the gaps between the metal lines and having at least one vertical portions, said at least one vertical portion of said material extending above said metal lines;

(c) a protective layer formed directly over and in direct contact with lines and the material, wherein the protective layer covers said at least one vertical portion of the material;

(d) a dielectric layer formed over the protective layer, wherein the dielectric layer has a different composition than the protective layer;

(e) one or more vias etched in the dielectric layer;

(f) a metal within the vias;

(g) a second metal layer formed over and in direct contact with the dielectric layer; and (h) one or more openings in the protective layer for allowing the metal in the vias to contact the metal lines.

20. An interconnect comprising:

(a) one or more metal lines formed from a first metal layer, said metal lines having gaps therebetween;

(b) low-k material filling all of the gaps between the metal lines and having a at least one vertical portions, said at least one vertical portion of said low-k material extending above said metal lines;

(c) a protective layer formed directly over the metal lines and the low-k material, wherein the protective layer covers said at least one vertical portion of the low-k material, and wherein the protective layer includes an oxide;

(d) a dielectric layer formed over the protective layer, wherein the dielectric layer has a different composition than the low-k material and the protective layer;

(e) one or more vias etched in the dielectric layer;

(f) a metal for filling the vias;

(g) a second metal layer formed over the dielectric layer; and (h) one or more openings in the protective layer for allowing the metal vias to contact the first metal lines.

21. The interconnect of claim 20, wherein the oxide includes silicon dioxide.

* * * * *